US011736103B2

(12) United States Patent
Atienza et al.

(10) Patent No.: US 11,736,103 B2
(45) Date of Patent: Aug. 22, 2023

(54) VOLTAGE SOURCE KICKSTART CIRCUIT FOR POWERING INTEGRATED CIRCUITS

(71) Applicant: Appleton Grp LLC, Rosemont, IL (US)

(72) Inventors: Joel Jeremiah Guevarra Atienza, Bulacan (PH); Mark Chester Bernardino Nepomuceno, Rizal (PH); Jonathan Art Fulgencio Recaflanca, Quezon (PH); Runelle Namoro Tria, Quezon (PH)

(73) Assignee: Appleton Grp LLC, Rosemont, IL (US)

( * ) Notice: Subject to any disclaimer, the term of this patent is extended or adjusted under 35 U.S.C. 154(b) by 0 days.

(21) Appl. No.: 17/349,615

(22) Filed: Jun. 16, 2021

(65) Prior Publication Data

US 2022/0407509 A1 Dec. 22, 2022

(51) Int. Cl.
*H03K 17/22* (2006.01)
*G01R 19/165* (2006.01)
*G06F 1/28* (2006.01)

(52) U.S. Cl.
CPC ..... *H03K 17/223* (2013.01); *G01R 19/16552* (2013.01); *G06F 1/28* (2013.01)

(58) Field of Classification Search
CPC .... H03K 17/223; G01R 19/16552; G06F 1/28
See application file for complete search history.

(56) References Cited

U.S. PATENT DOCUMENTS 4,710,859 A * 12/1987 Rilly .................... H02M 3/338
363/97
5,815,383 A 9/1998 Lei
(Continued)

FOREIGN PATENT DOCUMENTS

WO          2009095890 A2     8/2009
WO     WO-2020141501 A1  *  7/2020  ............ H02J 50/001

OTHER PUBLICATIONS

Microchip Technology Incorporated, high-voltage linear regulator bootstrap start-up circuit LR745, https://ww1.microchip.com/downloads/aemDocuments/documents/OTH/ProductDocuments/DataSheets/20005394A.pdf.
(Continued)

*Primary Examiner* — Metasebia T Retebo
*Assistant Examiner* — James G Yeaman
(74) *Attorney, Agent, or Firm* — McDonnell Boehnen Hulbert & Berghoff LLP (57) ABSTRACT

A system is described. The system includes a control transistor, a voltage source, a feedback node connected between a drain of the control transistor and the voltage source, a plurality of resistors connected between the voltage source and ground, and a control node connected to a gate of the control transistor. The resistors include a first series-connected set of resistors associated with the control transistor being biased and a second series-connected set of resistors associated with the control transistor being unbiased. During a startup period, the control node is configured to bias the control transistor to select the first series-connected set of resistors, thereby increasing a voltage level of the voltage source to a boosted VCC voltage. After the startup period, the control node is configured to unbias the control transistor to select the second series-connected set of resistors, thereby decreasing the boosted VCC voltage to a normal VCC voltage.

20 Claims, 4 Drawing Sheets

(56) References Cited

U.S. PATENT DOCUMENTS

| | | | | |
|---|---|---|---|---|
| 5,881,014 A * | 3/1999 | Ooishi | | G11C 5/143 |
| | | | | 327/536 |
| 6,642,790 B2 * | 11/2003 | Schrodinger | | H03F 3/4565 |
| | | | | 330/261 |
| 6,879,115 B2 | 4/2005 | Ribarich | | |
| 6,908,164 B2 | 6/2005 | Gilbert et al. | | |
| 6,911,809 B2 * | 6/2005 | Kernahan | | H02M 3/156 |
| | | | | 323/283 |
| 7,224,209 B2 * | 5/2007 | Hsu | | G05F 3/30 |
| | | | | 327/542 |
| 7,339,410 B1 | 3/2008 | Farrenkopf | | H03K 17/223 |
| | | | | 327/143 |
| 8,514,013 B2 * | 8/2013 | Takeuchi | | H01L 25/18 |
| | | | | 327/566 |
| 8,633,758 B2 * | 1/2014 | Fujisawa | | G11C 5/145 |
| | | | | 327/536 |
| 8,957,657 B2 * | 2/2015 | Zhao | | H03K 17/166 |
| | | | | 323/284 |
| 8,971,069 B2 | 3/2015 | Dunipace | | |
| 9,231,415 B2 * | 1/2016 | Kainuma | | H02M 5/458 |
| 9,812,976 B2 | 11/2017 | Choi | | |
| 10,027,312 B2 * | 7/2018 | Wang | | H03L 7/00 |
| 10,153,702 B2 | 12/2018 | Teo et al. | | |
| 10,250,999 B1 * | 4/2019 | Polo | | B81B 7/008 |
| 10,256,630 B2 | 4/2019 | Feldtkeller et al. | | |
| 10,263,532 B2 | 4/2019 | Melanson et al. | | |
| 10,861,639 B2 * | 12/2020 | Li | | H02M 3/33553 |
| 10,985,661 B2 * | 4/2021 | Deboy | | H02M 3/33507 |
| 2013/0127431 A1 | 5/2013 | Ansari | | |
| 2020/0304019 A1 | 9/2020 | Jain et al. | | |

OTHER PUBLICATIONS

Astec Power, Power Supply #8790021,38W (ASTEC #AA 11320), https://archive.org/details/pitsavers_astecAstecW_3570796.

* cited by examiner

VOLTAGE SOURCE KICKSTART CIRCUIT FOR POWERING INTEGRATED CIRCUITS

BACKGROUND OF THE INVENTION

The present disclosure relates to systems and methods for powering integrated circuits. Integrated circuits may have different ON thresholds that are higher than their respective operating thresholds. However, operating a VCC at a boosted steady state during operation may damage some integrated circuits.

SUMMARY

The present disclosure relates to a voltage source kickstart circuit for powering integrated circuits. In particular, examples describe a kickstart circuit that provides a temporarily-boosted VCC level during a startup period of a plurality of integrated circuits.

In one aspect, a system is described. The system includes a control transistor. The system also includes a voltage source configured to supply a voltage. The system also includes a feedback node connected between a drain of the control transistor and the voltage source. The system also includes a plurality of resistors connected between the voltage source and ground. The plurality of resistors includes a first series-connected set of resistors associated with the control transistor being biased and a second series-connected set of resistors associated with the control transistor being unbiased. The system also includes a control node connected to a gate of the control transistor. During a startup period, the control node is configured to bias the control transistor to select the first series-connected set of resistors, thereby setting a first feedback voltage at the feedback node that increases a voltage level of the voltage source to a boosted VCC voltage. After the startup period, the control node is configured to unbias the control transistor to select the second series-connected set of resistors, thereby setting a second feedback voltage at the feedback node that decreases the boosted VCC voltage of the voltage source to a normal VCC voltage.

In another aspect, a method for operating a voltage source kickstart circuit is described. The method includes during a startup period, biasing a control transistor to select a first series-connected set of resistors. The method also includes based on selecting the first series-connected set of resistors, setting a first feedback voltage at a feedback node that increases a voltage level of a voltage source to a boosted VCC voltage. The method also includes after the startup period, unbiasing the control transistor to select a second series-connected set of resistors. The method also includes based on selecting the second series-connected set of resistors, setting a second feedback voltage at the feedback node that decreases the boosted VCC voltage of the voltage source to a normal VCC voltage.

In another aspect, a system is described. The system includes a control transistor, a voltage source configured to supply a voltage, a plurality of integrated circuits supplied by the voltage source, a feedback node connected between a drain of the control transistor and the voltage source, a plurality of resistors connected between the voltage source and ground, and a control node connected to a gate of the control transistor. The plurality of resistors include a first series-connected set of resistors associated with the control transistor being biased and a second series-connected set of resistors associated with the control transistor being unbiased. During a startup period, the control node is configured to bias the control transistor to select the first series-connected set of resistors, thereby setting a first feedback voltage at the feedback node that increases a voltage level of the voltage source to a boosted VCC voltage. After the startup period, the control node is configured to unbias the control transistor to select the second series-connected set of resistors, thereby setting a second feedback voltage at the feedback node that decreases the boosted VCC voltage of the voltage source to a normal VCC voltage.

These, as well as other aspects, advantages, and alternatives, will become apparent to those of ordinary skill in the art by reading the following detailed description, with reference where appropriate to the accompanying drawings.

DETAILED DESCRIPTION

Example methods and systems are described herein. The words "example," "exemplary," and "illustrative" are used herein to mean "serving as an example, instance, or illustration." Any embodiment or feature described herein as being an "example," being "exemplary," or being "illustrative" is not necessarily to be construed as preferred or advantageous over other embodiments or features. The example embodiments described herein are not meant to be limiting. It will be readily understood that the aspects of the present disclosure, as generally described herein, and illustrated in the figures, can be arranged, substituted, combined, separated, and designed in a wide variety of different configurations, all of which are explicitly contemplated herein.

The following description relates to voltage source kickstart circuits used for powering integrated circuits during a startup period. Integrated circuits may have a relatively large range of ON threshold voltages (e.g., between 11 and 13 V). Additionally, integrated circuits may also have lower operating voltage than ON threshold voltages, and prolonged exposure to the ON threshold voltages may damage the integrated circuits or result in increased dissipation that causes the integrated circuits to operate in higher temperature. Accordingly, a system with a plurality of integrated circuits may require a plurality of voltage sources (otherwise referred to as VCCs) with different voltage outputs.

Example voltage source kickstart circuits resolve these issues by providing a temporarily-boosted VCC voltage to facilitate startup for a range of integrated circuits. The boosted VCC voltage last long enough for a startup period to end, then reduced to a level that is suitable for operation of a plurality of different integrated circuits. Different aspects of a voltage source kickstart circuit can be adjusted for compatibility with a plurality of different integrated circuits.

Within examples, boosting the VCC voltage coincides with charging and discharging a capacitor. An RC constant of the circuit allows for precise control of the duration of boosting the VCC voltage. For example, the RC constant can be set based on a maximum startup period of integrated circuits in the system.

Within examples, boosting the VCC voltage includes biasing a control transistor during a startup period, which selects a particular set of resistors and in turn sets a particular feedback voltage at a feedback node of the voltage source kickstart circuit, thereby increasing the VCC voltage. After the startup period, the control transistor is unbiased, which selects a different set of resistors and in turn sets a different feedback voltage at the feedback node that reduces the VCC voltage back to a normal level.

The disclosed voltage source kickstart circuits and related systems are useful in a variety of embodiments, including but not limited to being implemented with an auxiliary supply circuit within a switched-mode power supply. Additionally or alternatively, the disclosed voltage source kickstart circuits and related systems can be implemented within other electronic devices that have multiple integrated circuits with different ON thresholds, as the voltage source kickstart circuit can be tuned to provide a temporary VCC boost to the integrated circuits that is greater than or equal to the maximum ON threshold of the integrated circuits. Other examples advantages are possible as well, and will be discussed in more detail herein.

Reference will now be made in detail to various embodiments, examples of which are illustrated in the accompanying drawings. In the following detailed description, numerous specific details are set forth in order to provide a thorough understanding of the present disclosure and the described embodiments. However, the present disclosure may be practiced without these specific details. In other instances, well-known methods, procedures, and components, and circuits have not been described in detail so as not to unnecessarily obscure aspects of the embodiments.

Figure 1:
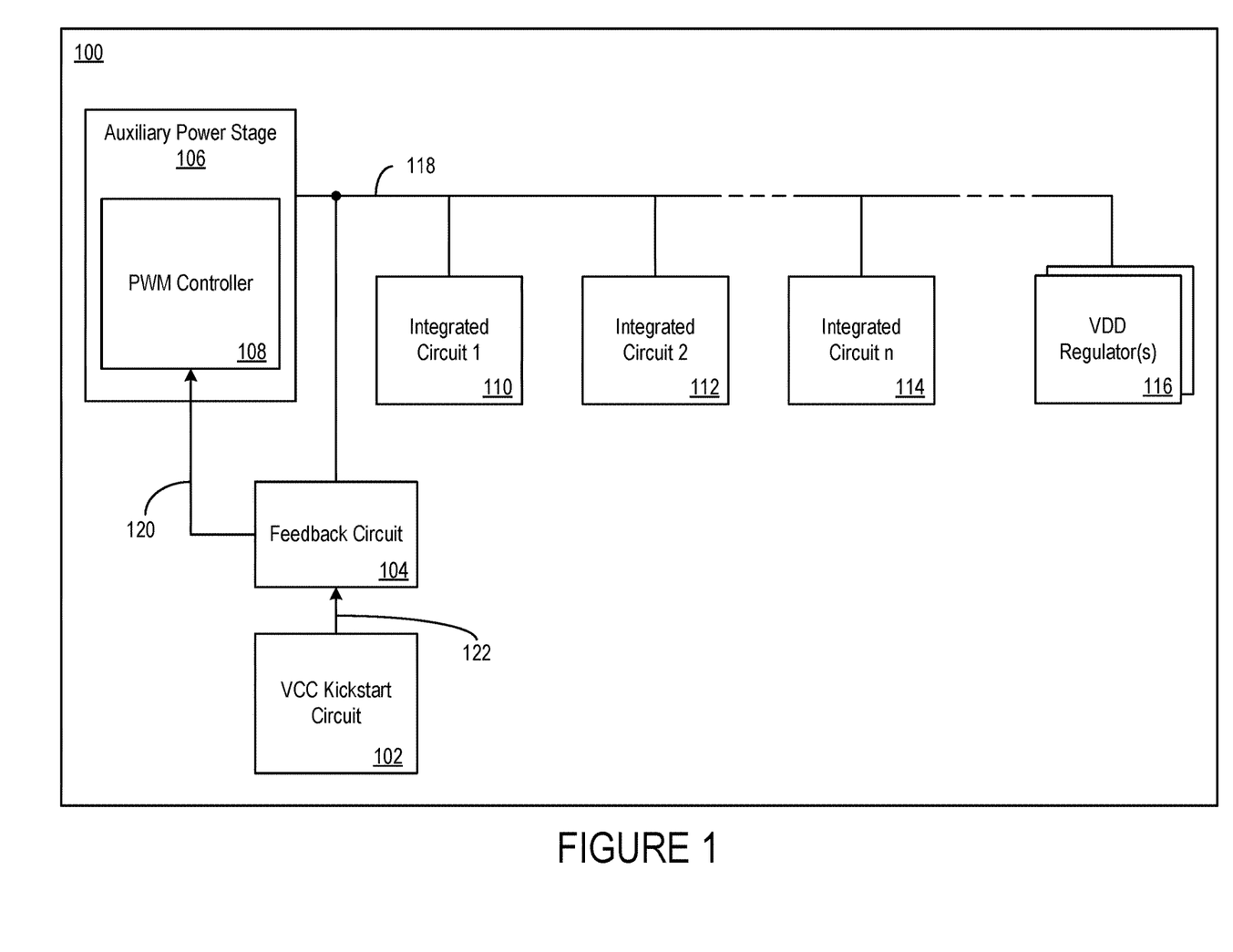
FIG. 1 depicts a system, according to an example implementation.

FIG. 1 depicts a system, according to an example implementation. In particular, FIG. 1 shows a system 100. Within examples, the system 100 is, is connected to, or includes a power supply unit (PSU), such as a switched-mode power supply. In the following description, the system 100 will be described primarily as a PSU.

The system 100 includes a VCC kickstart circuit 102, a feedback circuit 104, and an auxiliary power stage 106 (i.e., an auxiliary power supply circuit) having a pulse width modulation (PWM) controller 108.

As shown, the system 100 can also include a plurality of integrated circuits, including a first integrated circuit 110, a second integrated circuit 112, and an nth integrated circuit 114 as a representative example, although more or less integrated circuits are possible in alternative embodiments. Each of the integrated circuits may have different ON voltages, different OFF voltages, different startup periods, and different operation voltages. Still further, the system 100 includes VDD regulator(s) 116, such as those used for regulating one or more microcontroller units (MCUs) (not shown) and memory (not shown).

The auxiliary power stage 106 is configured to provide a VCC output 118 that powers the plurality of integrated circuits. Within examples, the auxiliary power stage 106 can take the form of a power converter that provides VCC voltage to integrated circuits within a PSU, such as those shown in FIG. 1. In such a scenario, the auxiliary power stage 106 is a separate converter from the main power stages in the PSU.

The PWM controller 108 of the auxiliary power stage 106 is an integrated circuit that provides PWM signals to switches of the auxiliary power stage 106 to generate output depending on the voltage being sensed from the feedback circuit 104. The PWM controller 108 also senses a voltage level of a feedback node 120, which can further facilitate control of the VCC output 118. Specifically, the PWM controller 108 is configured to read feedback voltages from the feedback node 120 and control a pulse width modulation of an auxiliary VCC supply circuit (i.e., the auxiliary power stage 106).

The feedback circuit 104 is configured to check the current level of the VCC output 118 and signal to the PWM controller 108 in order to decrease or increase the VCC output 118.

The VCC kickstart circuit 102 provides an output of VCC voltage 122, which can be used to help power the plurality of integrated circuits. Further, the VCC kickstart circuit 102 is configured to alter the feedback circuit 104 during startup (e.g., by selecting certain resistors, as discussed in more detail below) so as to provide a boost to the VCC output 118. This alteration can change a close loop or steady state voltage VCC output 118 that is used as a supply voltage for at least some (e.g., a majority) of the components of the system 100, such as the plurality of integrated circuits. In particular, the act of the VCC kickstart circuit 102 altering the feedback circuit 104 can signal to the PWM controller 108 to boost the VCC output 118 of the auxiliary power stage 106 during startup. The steady state of the VCC kickstart circuit 102 can be within the operating range of the plurality of integrated circuits.

Figure 2:
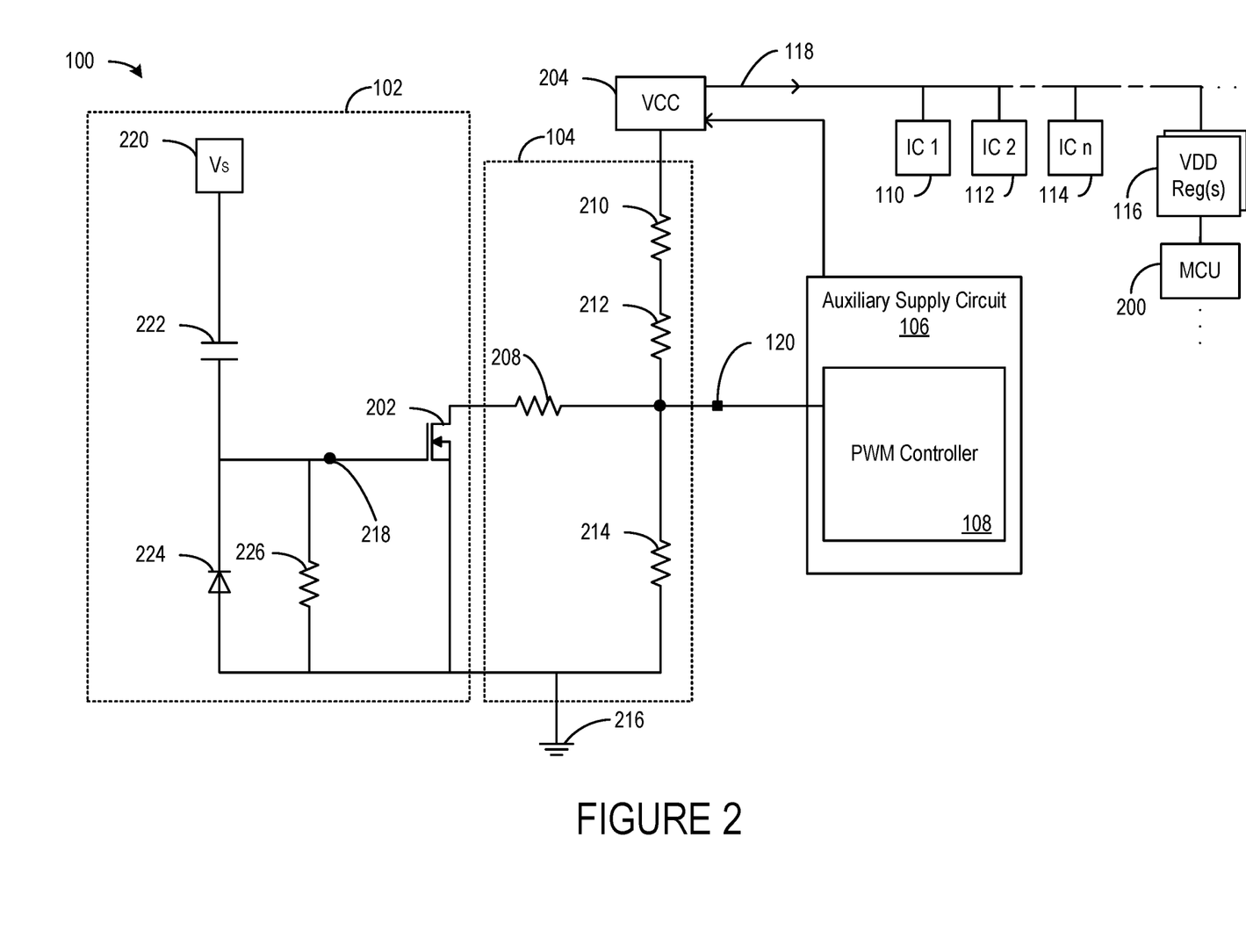
FIG. 2 depicts a circuit diagram of the system of FIG. 1, according to an example implementation.

FIG. 2 depicts a circuit diagram of system 100, according to an example implementation. In particular, as shown, system 100 includes the VCC kickstart circuit 102 (referred to hereinafter as the "voltage source kickstart circuit 102"), the feedback circuit 104, the auxiliary power stage 106, the PWM controller 108, the feedback node 120 (which could alternatively be a pin of the PWM controller 108), the first integrated circuit 110, the second integrated circuit 112, the nth integrated circuit 114 circuit, the VDD regulator(s) 116, and a MCU 200 (e.g., a 3.3V or 5.1V MCU).

The voltage source kickstart circuit 102 includes a control transistor 202. In the present example, the control transistor 202 is depicted as an N-channel MOSFET, though other types of transistors are possible, such as a BJT transistor The voltage source kickstart circuit 102 also includes a voltage source 204 configured to supply a normal VCC voltage. The voltage source kickstart circuit 102 also includes a feedback node 120 connected between a drain of the control transistor 202 and the voltage source 204.

Although the voltage source kickstart circuit 102, the feedback circuit 104, the voltage source 204, and the feedback node 120 are illustrated as separate elements, in some embodiments, the voltage source kickstart circuit 102 could include the feedback circuit 104, the voltage source 204, and the feedback node 120.

As further shown, the feedback circuit 104 includes a plurality of resistors 208, 210, 212, 214 connected between the voltage source 204 and ground 216. The plurality of resistors 208, 210, 212, 214 comprises a first series-connected set of resistors 208, 210, 212 associated with the control transistor 202 being biased and a second series-connected set of resistors 210, 212, 214 associated with the control transistor 202 being unbiased. Resistor 208 is connected between the drain of the control transistor 202 and the feedback node 120. Resistor 210 and resistor 212 are connected in series between the voltage source 204 and the feedback node 120. Resistor 214, which is connected between the feedback node 120 and ground 216, is also connected in parallel with resistor 208, and in series with resistor 210 and resistor 212.

The voltage source kickstart circuit 102 further includes a control node 218 connected to a gate of the control transistor 202. The control node 218 can be connected to a controller (e.g., a controller having a processor and memory) and/or other device or device(s) of the system 100 that can be used to control the control transistor 202. In operation, for instance, the control node 218 is used to bias or unbias the control transistor 202.

Specifically, during a startup period, the control node 218 is configured to bias the control transistor 202 to select the first series-connected set of resistors 208, 210, 212, thereby setting a first feedback voltage at the feedback node 120 that increases a voltage level of the voltage source 204 to a boosted VCC voltage (e.g., from 0 V to the boosted VCC voltage). Biasing the control transistor 202 adds resistor 208, and because resistor 208 and resistor 214 are in parallel, the total resistance between the feedback node 120 and ground 216 is lower, which reduces the voltage at the feedback node 120 and increases the voltage level of the voltage source 204 to the boosted VCC voltage.

The duration of the startup period can be set in various ways. As shown in FIG. 2, for instance, the voltage source kickstart circuit 102 includes an RC circuit connected to the control node 218. The RC circuit is a representative example of a device or other circuitry that can be used to control the control transistor 202. As shown, the RC circuit includes a supply voltage source 220 connected to a capacitor 222. The capacitor is connected to the control node 218. The RC circuit also includes a diode 224 and a resistor 226, which are connected to the capacitor 222, and which are also connected in parallel and to ground 216. The diode 224 provides a discharge path for energy stored in the capacitor 222 whenever the supply voltage source 220 turns off. This is to help ensure that the capacitor 222 is fully discharged before the next startup phase and to help ensure that the VCC boost duration is not shortened.

In the example shown in FIG. 2, the startup period is set by the RC time constant. That is, the startup period is defined by a period of time to charge the capacitor 222 to a control voltage. In other words, the capacitor 222 charges to the supply voltage source 220 for a period of time set by the capacitor 222 and the resistor 226.

In alternative examples, the control node 218 can be connected to a controller (not shown) that is configured to set the startup period and control the control transistor 202.

After the startup period, the control node 218 is configured to unbias the control transistor 202 to select the second series-connected set of resistors 210, 212, 214, thereby setting a second feedback voltage at the feedback node 120 that decreases the boosted VCC voltage of the voltage source 204 to the normal VCC voltage. Unbiasing the control transistor 202 removes resistor 208, and because only resistor 214 remains between the feedback node 120 and ground 216, the total resistance between the feedback node 120 and ground 216 is higher, which increases the voltage at the feedback node 120 and decreases the boosted VCC voltage of the voltage source 204 to the normal VCC voltage. That is, when the capacitor 222 is fully charged, the bias on the control transistor 202 is removed, and as the control transistor 202 turns off, the voltage level of the voltage source 204 falls from the boosted VCC voltage to the normal VCC voltage.

Table 1 below summarizes the status of the control transistor 202 and the capacitor 222 during three phases of operation of the voltage source kickstart circuit 102. The first phase is the startup period described above. The second phase, designated as "VCC Boost," is when the voltage source 204 is at the boosted VCC voltage, as also described above. The third phase, designated as "VCC Normal," is when the voltage source 204 decreases to the normal VCC voltage, as also described above.

TABLE 1

| Phase | Status of Control Transistor 202 | Status of Capacitor 222 |
| --- | --- | --- |
| Startup | Biased | Charging |
| VCC Boost | ON | Charging |
| VCC Normal | Unbiased | Charged |

Figure 3:
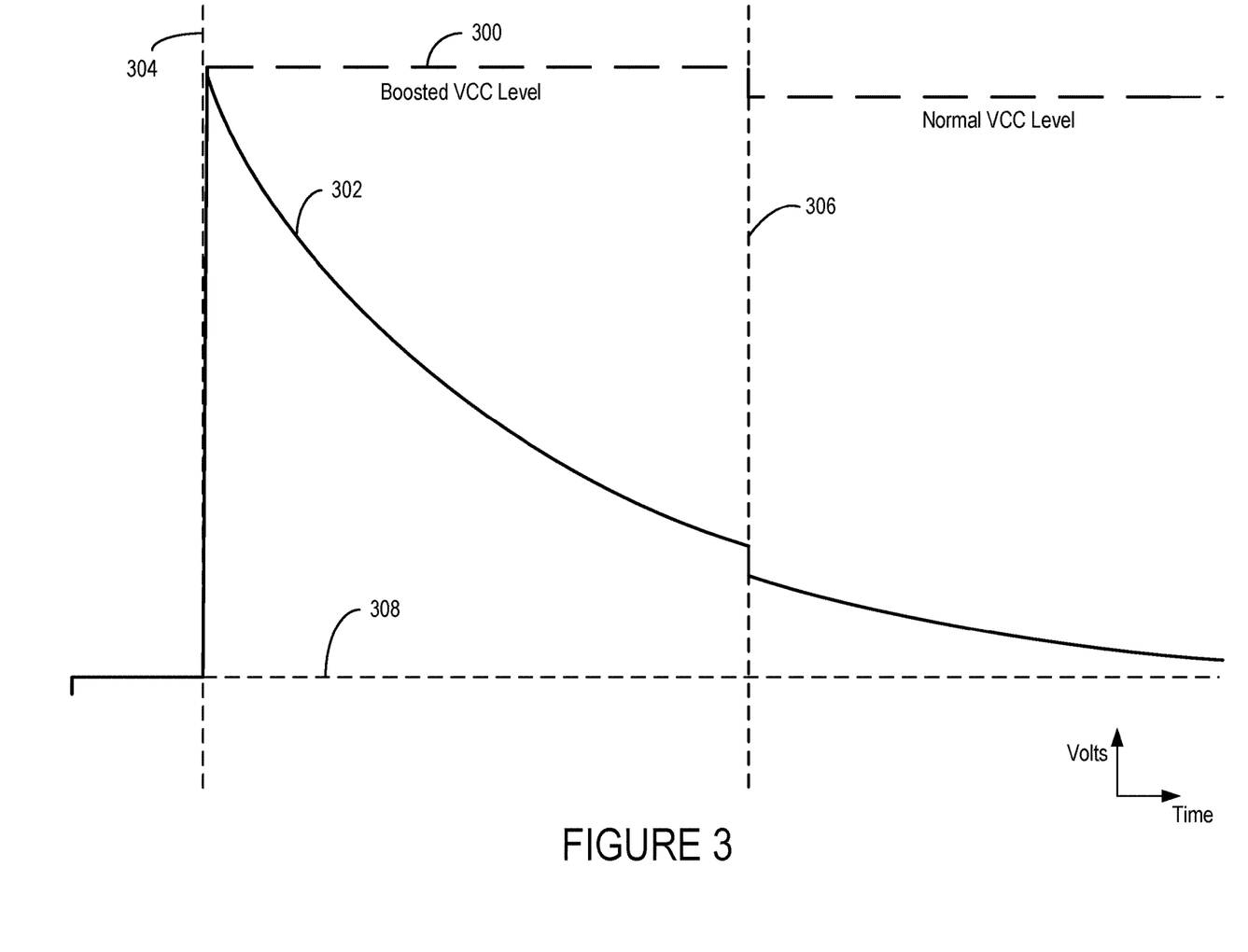
FIG. 3 depicts voltage levels of the system of FIG. 1, according to an example implementation.

FIG. 3 depicts voltage levels of the system 100, according to an example implementation. In particular, FIG. 3 depicts a first waveform 300 of the voltage level of the voltage source 204, which is designated as a dashed line. FIG. 3 further depicts a second waveform 302 of the voltage level at the gate of the control transistor 202, which is designated as a solid line. As shown by the first waveform 300, the voltage level of the voltage source 204 is temporarily boosted during the startup period—that is, between a start time 304 of the startup period and an end time 306 of the startup period. At or a short time after the start time 304, the control transistor 202 gate voltage is raised, and the gate voltage is discharged throughout the startup period (and after the startup period) until the gate voltage approaches a discharged voltage level 308.

Arranged and operated as described above, the system 100 can advantageously be used to provide startup bias for integrated circuits with a wide range of ON threshold voltages, as well as for systems that include multiple integrated circuits that each have different ON threshold voltages. The normal VCC voltage and the boosted VCC voltage (i.e., the temporarily-boosted, kickstarted VCC level) can be set based at least in part on one or more parameters of the one or more integrated circuits to which the voltage source 204 supplies VCC voltage.

When the system 100 includes or is connected to a plurality of integrated circuits (e.g., the first integrated circuit 110, the second integrated circuit 112, etc., up to the nth integrated circuit 114), each having a respective ON threshold voltage and a respective OFF threshold voltage, the boosted VCC voltage can be set based on a maximum ON threshold voltage of the plurality of integrated circuits (i.e., the highest ON threshold voltage of the plurality of integrated circuits) and the normal VCC voltage can be set based on a maximum OFF threshold voltage of the plurality of integrated circuits (i.e., the highest OFF threshold voltage of the plurality of integrated circuits). By way of example, the first series-connected set of resistors 208, 210, 212 is configured to set the first feedback voltage and thereby drive the boosted VCC voltage of the voltage source 204 at or above a maximum ON threshold voltage of the plurality of integrated circuits during the startup period. In other words, using the voltage source kickstart circuit 102, the voltage source 204 can provide an increased startup bias that meets or exceeds the maximum ON threshold for each integrated circuit that is supplied by the voltage source 204. Further, the second series-connected set of resistors 210, 212, 214 is configured to set the second feedback voltage and to thereby drive the normal VCC voltage of the voltage source 204 above a maximum OFF threshold voltage of the plurality of integrated circuits after the startup period.

In some instances, in order to prevent damage to components, it is desirable for the boosted VCC voltage not to exceed the minimum absolute maximum rating of the plurality of integrated circuits (i.e., the lowest absolute maximum rating of the plurality of integrated circuits).

In alternative examples, the voltage source 204 can be connected to and supply voltage to a single integrated circuit. As such, the first series-connected set of resistors 208, 210, 212 is configured to set the first feedback voltage and thereby drive the boosted VCC voltage of the voltage source 204 at or above the ON threshold voltage of the single integrated circuit during the startup period, and the second series-connected set of resistors 210, 212, 214 is configured to set the second feedback voltage and to thereby drive the normal VCC voltage of the voltage source 204 at or above the OFF threshold voltage of the single integrated circuit after the startup period.

In still further examples, the startup period (e.g., RC time constant of the RC circuit) can be set based on a consideration of how long it takes to turn on all of the power stages in the PSU (e.g., system 100, in embodiments where system 100 is a PSU) or in a device having a voltage source and corresponding circuitry. For instance, in some implementations, and as shown in FIG. 1 and FIG. 2, the voltage source 204 can be connected to a plurality of integrated circuits (e.g., the first integrated circuit 110, the second integrated circuit 112, etc.) and one or more MCU regulators (e.g., VDD regulator(s) 116). The plurality of integrated circuits and the one or more MCU regulators 116 can each be configured to control a respective different circuit in the PSU, such as a respective different power stage in the PSU. Further, each such power stage can have a respective startup duration. As such, the startup period can be selected to be longer than a total duration of the plurality of power stages. As a more particular example, consider an auxiliary VCC supply circuit that turns off once a supply with a higher steady-state voltage level than that of the auxiliary VCC supply takes over the VCC bus. In this case, the duration of the kickstarted VCC level must be enough to startup the PWM controller 108 that energizes the higher steady-state VCC supply.

Figure 4:
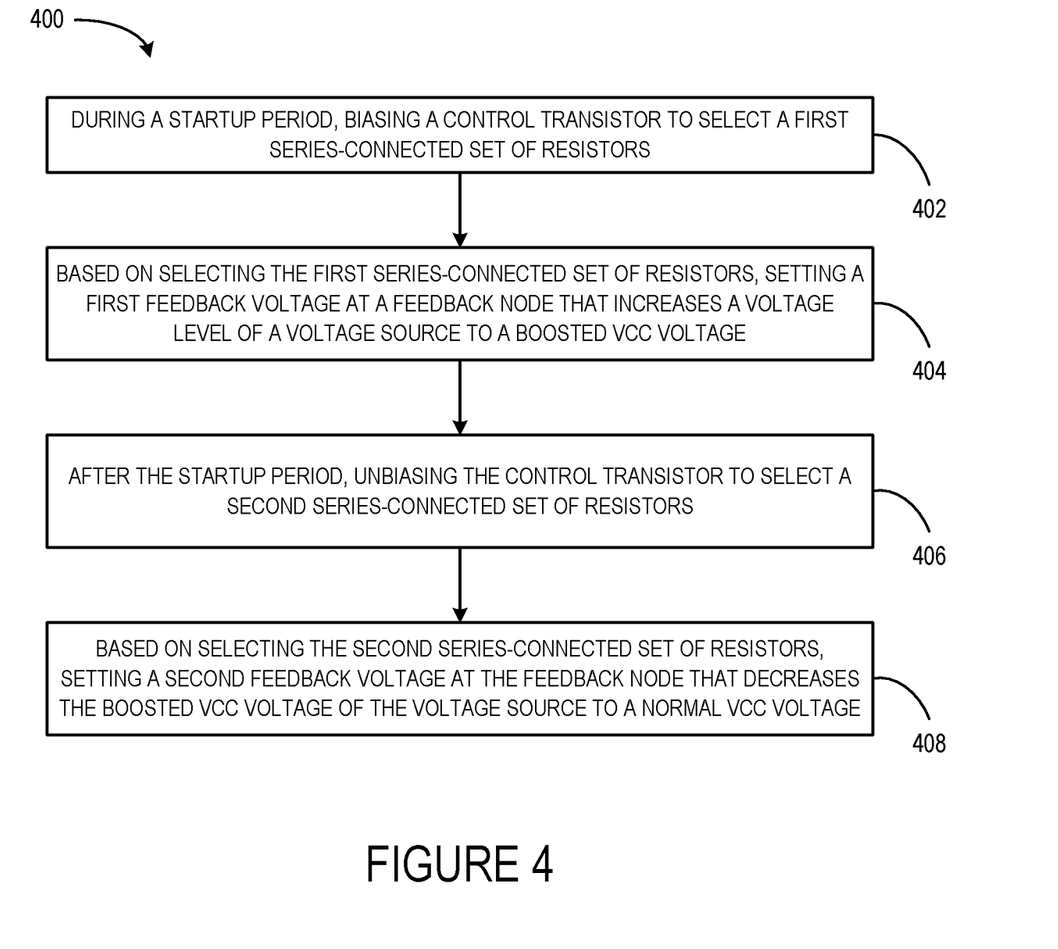
FIG. 4 depicts a flowchart of a method, according to an example implementation.

FIG. 4 depicts a flowchart of a method 400 for operating a voltage source kickstart circuit, according to an example implementation. Method 400 shown in FIG. 4 presents an example of a method that could be used with the system 100 described herein with respect to FIGS. 1, 2, and 3, or with components thereof. Further, devices or systems may be used or configured to perform logical functions presented in FIG. 4. Method 400 may include one or more operations, functions, or actions as illustrated by one or more of blocks 402-408. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

For this and other processes and methods disclosed herein, flowcharts show functionality and operation of one possible implementation of present examples. Each block or portions of each block may represent a module, a segment, or a portion of program code, which includes one or more instructions executable by a processor for implementing specific logical functions or steps in the process. The program code may be stored on any type of computer readable medium or data storage, for example, such as a storage device including a disk or hard drive. Further, the program code can be encoded on a computer-readable storage media in a machine-readable format, or on other non-transitory media or articles of manufacture. The computer readable medium may include non-transitory computer readable medium or memory, for example, such as computer-readable media that stores data for short periods of time like register memory, processor cache and Random Access Memory (RAM). The computer readable medium may also include non-transitory media, such as secondary or persistent long-term storage, like read only memory (ROM), optical or magnetic disks, compact-disc read only memory (CD-ROM), for example. The computer readable media may also be any other volatile or non-volatile storage systems. The computer readable medium may be considered a tangible computer readable storage medium, for example.

In addition, each block or portions of each block in FIG. 4, and within other processes and methods disclosed herein, may represent circuitry that is wired to perform the specific logical functions in the process. For example, a microcontroller unit, special-purpose processor, analog control circuitry, or the like can be used to carry out the blocks described in relation to method 400. Alternative implementations are included within the scope of the examples of the present disclosure in which functions may be executed out of order from that shown or discussed, including substantially concurrent or in reverse order, depending on the functionality involved, as would be understood by those reasonably skilled in the art.

At block 402, the method 400 includes during a startup period, biasing a control transistor to select a first series-connected set of resistors.

At block 404, the method 400 includes based on selecting the first series-connected set of resistors, setting a first feedback voltage at a feedback node that increases a voltage level of a voltage source to a boosted VCC voltage.

At block 406, the method 400 includes after the startup period, unbiasing the control transistor to select a second series-connected set of resistors.

At block 408, the method 400 includes based on selecting the second series-connected set of resistors, setting a second feedback voltage at the feedback node that decreases the boosted VCC voltage of the voltage source to a normal VCC voltage.

Within examples, a plurality of integrated circuits are supplied by the voltage source. In such examples, the act of increasing the voltage level of the voltage source to the boosted VCC voltage involves setting the first feedback voltage thereby driving the boosted VCC voltage of the voltage source at or above a maximum ON threshold voltage of the plurality of integrated circuits during the startup period. For example, this may be carried out as described above with respect to FIG. 2.

Within examples, each integrated circuit has an OFF threshold voltage. In such examples, the act of setting the second feedback voltage drives the normal VCC voltage of the voltage source above a maximum OFF threshold voltage of the plurality of integrated circuits after the startup period. For example, this may be carried out as described above with respect to FIG. 2.

Within examples, the method 400 also includes charging a capacitor to a control voltage. In such examples, the startup period is defined by a period of time to charge the capacitor. For example, this may be carried out as described above with respect to FIG. 2.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purpose of illustration and are not intended to be limiting, with the true scope being indicated by the following claims.

What is claimed is:

1. A system comprising:
a control transistor;
a voltage source configured to supply a voltage;
a feedback node connected between a drain of the control transistor and the voltage source;
a plurality of resistors connected between the voltage source and ground, wherein the plurality of resistors comprises a first series-connected set of resistors associated with the control transistor being biased and a second series-connected set of resistors associated with the control transistor being unbiased, wherein the first series-connected set of resistors comprises at least two resistors connected in series with each other, wherein the second series-connected set of resistors comprises at least two resistors connected in series with each other, and wherein at least one resistor of the first series-connected set of resistors is in parallel with at least one resistor of the second series-connected set of resistors when the control transistor is biased; and
a control node connected to a gate of the control transistor,
wherein, during a startup period, the control node is configured to bias the control transistor to select the first series-connected set of resistors, thereby setting a first feedback voltage at the feedback node that increases a voltage level of the voltage source to a boosted VCC voltage, and
wherein, after the startup period, the control node is configured to unbias the control transistor to select the second series-connected set of resistors, thereby setting a second feedback voltage at the feedback node that decreases the boosted VCC voltage of the voltage source to a normal VCC voltage.

2. The system of claim 1, further comprising:
a plurality of integrated circuits supplied by the voltage source,
wherein each integrated circuit has an ON threshold voltage, and
wherein the first series-connected set of resistors is configured to set the first feedback voltage and to thereby drive the boosted VCC voltage of the voltage source at or above a maximum ON threshold voltage of the plurality of integrated circuits during the startup period.

3. The system of claim 2, wherein each integrated circuit has an OFF threshold voltage, and wherein the second series-connected set of resistors is configured to set the second feedback voltage and to thereby drive the normal VCC voltage of the voltage source above a maximum OFF threshold voltage of the plurality of integrated circuits after the startup period.

4. The system of claim 1, wherein the voltage source is configured to supply a VCC voltage to a plurality of integrated circuits.

5. The system of claim 1, further comprising:
a capacitor connected to the control node,
wherein the startup period is defined by a period of time to charge the capacitor to a control voltage.

6. The system of claim 1, wherein the voltage source is connected to a plurality of integrated circuits and one or more microcontroller unit (MCU) regulators,
wherein the plurality of integrated circuits and the one or more MCU regulators are configured to control different circuits in a power supply system, the different circuits including a plurality of power stages each having a respective startup duration, and
wherein the startup period is longer than a total duration of the plurality of power stages.

7. The system of claim 1, wherein the control node is connected to a controller configured to set the startup period.

8. The system of claim 1, wherein the feedback node is connected to a controller configured to set the first feedback voltage.

9. A method for operating a voltage source kickstart circuit, the method comprising:
during a startup period, biasing a control transistor to select a first series-connected set of resistors, wherein the first series-connected set of resistors comprises at least two resistors connected in series with each other;
based on selecting the first series-connected set of resistors, setting a first feedback voltage at a feedback node that increases a voltage level of a voltage source to a boosted VCC voltage;
after the startup period, unbiasing the control transistor to select a second series-connected set of resistors, wherein the second series-connected set of resistors comprises at least two resistors connected in series with each other, and wherein at least one resistor of the first series-connected set of resistors is in parallel with at least one resistor of the second series-connected set of resistors; and
based on selecting the second series-connected set of resistors, setting a second feedback voltage at the feedback node that decreases the boosted VCC voltage of the voltage source to a normal VCC voltage.

10. The method of claim 9, wherein a plurality of integrated circuits are supplied by the voltage source, and
wherein increasing the voltage level of the voltage source to the boosted VCC voltage comprises setting the first feedback voltage thereby driving the boosted VCC voltage of the voltage source at or above a maximum ON threshold voltage of the plurality of integrated circuits during the startup period.

11. The method of claim 10, wherein each integrated circuit has an OFF threshold voltage, and
wherein setting the second feedback voltage drives the normal VCC voltage of the voltage source above a maximum OFF threshold voltage of the plurality of integrated circuits after the startup period.

12. The method of claim 9, further comprising:
charging a capacitor to a control voltage,
wherein the startup period is defined by a period of time to charge the capacitor.

13. A system comprising:
a control transistor;
a voltage source configured to supply a voltage;
a plurality of integrated circuits supplied by the voltage source;
a feedback node connected between a drain of the control transistor and the voltage source;
a plurality of resistors connected between the voltage source and ground, wherein the plurality of resistors comprises a first series-connected set of resistors associated with the control transistor being biased and a second series-connected set of resistors associated with the control transistor being unbiased, wherein the first series-connected set of resistors comprises at least two resistors connected in series with each other, wherein the second series-connected set of resistors comprises at least two resistors connected in series with each other, and wherein at least one resistor of the first series-connected set of resistors is in parallel with at least one resistor of the second series-connected set of resistors when the control transistor is biased; and a control node connected to a gate of the control transistor,
  wherein, during a startup period, the control node is configured to bias the control transistor to select the first series-connected set of resistors, thereby setting a first feedback voltage at the feedback node that increases a voltage level of the voltage source to a boosted VCC voltage, and
  wherein, after the startup period, the control node is configured to unbias the control transistor to select the second series-connected set of resistors, thereby setting a second feedback voltage at the feedback node that decreases the boosted VCC voltage of the voltage source to a normal VCC voltage.

14. The system of claim 13, further comprising:
a voltage source kickstart circuit,
wherein the voltage source kickstart circuit comprises the control transistor, the voltage source, and the feedback node.

15. The system of claim 13, further comprising:
a controller, wherein the controller is configured to read feedback voltages from the feedback node and control a pulse width modulation of an auxiliary VCC supply circuit.

16. The system of claim 13,
  wherein each integrated circuit has an ON threshold voltage, and
  wherein the first series-connected set of resistors is configured to set the first feedback voltage and to thereby drive the boosted VCC voltage of the voltage source at or above a maximum ON threshold voltage of the plurality of integrated circuits during the startup period.

17. The system of claim 13, wherein each integrated circuit has an OFF threshold voltage, and
  wherein the second series-connected set of resistors is configured to set the second feedback voltage and to thereby drive the normal VCC voltage of the voltage source above a maximum OFF threshold voltage of the plurality of integrated circuits after the startup period.

18. The system of claim 13, further comprising:
a capacitor connected to the control node,
wherein the startup period is defined by a period of time to charge the capacitor to a control voltage.

19. The system of claim 1, wherein the first series-connected set of resistors and the second series-connected set of resistors share at least one common resistor.

20. The system of claim 19, wherein the first series-connected set of resistors comprises three resistors, the second series-connected set of resistors comprises three resistors, and share one common resistor.

* * * * *